US011231968B2

(12) United States Patent
Schmitz et al.

(10) Patent No.: US 11,231,968 B2
(45) Date of Patent: Jan. 25, 2022

(54) METHOD FOR IDENTIFYING BUS NODES IN A BUS SYSTEM

(71) Applicant: ELMOS SEMICONDUCTOR SE, Dortmund (DE)

(72) Inventors: Christian Schmitz, Castrop-Rauxel (DE); Bernd Burchard, Essen (DE)

(73) Assignee: ELMOS SEMICONDUCTOR SE, Dortmund (DE)

( * ) Notice: Subject to any disclaimer, the term of this patent is extended or adjusted under 35 U.S.C. 154(b) by 0 days.

(21) Appl. No.: 15/734,796

(22) PCT Filed: May 23, 2019

(86) PCT No.: PCT/EP2019/063333
§ 371 (c)(1),
(2) Date: Dec. 16, 2020

(87) PCT Pub. No.: WO2019/233776
PCT Pub. Date: Dec. 12, 2019

(65) Prior Publication Data
US 2021/0173717 A1 Jun. 10, 2021

(30) Foreign Application Priority Data

Jun. 5, 2018 (EP) ..................................... 18176099

(51) Int. Cl.
*G06F 12/10* (2016.01)
*G06F 9/50* (2006.01)
(Continued)

(52) U.S. Cl.
CPC ....... *G06F 9/5077* (2013.01); *G01R 19/0092* (2013.01); *G06F 13/4282* (2013.01);
(Continued)

(58) Field of Classification Search
CPC .............. G06F 9/5077; G06F 13/4282; G01R 19/0092; H04L 12/10; H04L 12/40045; H04L 61/2038
See application file for complete search history.

(56) References Cited

U.S. PATENT DOCUMENTS

| 8,504,748 | B2 * | 8/2013 | Matsuo | ................. H04L 12/403 |
| | | | | 710/110 |
| 8,935,450 | B2 * | 1/2015 | Nierop | .............. H04L 12/40045 |
| | | | | 710/110 |
| 2012/0284441 | A1 * | 11/2012 | Landman | ............ G06F 13/4295 |
| | | | | 710/110 |

FOREIGN PATENT DOCUMENTS

EP    1490772 B1    6/2005

OTHER PUBLICATIONS

International Application No. PCT/EP2019/063333, International Search Report and Written Opinion dated Sep. 3, 2019, 22 pages.
(Continued)

*Primary Examiner* — Henry Tsai
*Assistant Examiner* — Harry Z Wang
(74) *Attorney, Agent, or Firm* — Mindful IP PLLC

(57) ABSTRACT

A method for identifying bus nodes in a bus system makes it possible to be able to operate bus slaves of two different types in mixed systems. The detection of which bus slave has not yet been allocated an address in an addressing phase is carried out differently depending on a type of the bus slave. In all cases, however, the bus slave connected to the bus line farthest away from the bus master is identified as that bus slave to which an address is to be allocated.

6 Claims, 11 Drawing Sheets

(51) Int. Cl.
*G01R 19/00* (2006.01)
*G06F 13/42* (2006.01)
*H04L 12/10* (2006.01)
*H04L 12/40* (2006.01)
*H04L 29/12* (2006.01)

(52) U.S. Cl.
CPC ........ *H04L 12/10* (2013.01); *H04L 12/40045* (2013.01); *H04L 61/2038* (2013.01)

(56) References Cited

OTHER PUBLICATIONS

Local Interconnect Network, "LIN Bus Shunt Slave Node Position Detection-Revision 1.0," Dec. 10, 2008, pp. 1-24.
Elmos Semiconductor AG, "E521.36-RGB LIN Controller with Current Source," May 23, 2017, pp. 1-129.

* cited by examiner

METHOD FOR IDENTIFYING BUS NODES IN A BUS SYSTEM

CROSS REFERENCE TO RELATED APPLICATIONS

The present patent application is a national stage of, and claims priority from, Patent Cooperation Treaty Application No. PCT/EP2019/063333, filed on May 23, 2019, which application claims priority from European patent application 18 176 099.2 of 5 Jun. 2018, whose content is hereby incorporated with reference to the subject matter of the present patent application.

TECHNICAL FIELD

The disclosure relates to a method for identifying bus nodes in a bus system. In particular, the disclosure relates to a method for allocating addresses in a serial data bus system which has a bus line, a bus master, and multiple bus slaves, wherein the bus master is connected to the bus line on one side and the bus slaves are successively connected to the bus line on the other side when viewed from the bus master.

BACKGROUND

A plurality of methods exists for automatic allocation of addresses, in particular, in serial data bus systems (see EP-B-1 490 772, DE-A-10 2010 026 431, "LIN Bus Shunt Slave Node Position Detection—Revision 1.0", chapter 3.3, 10 Dec. 2008, E521.36—RGB LIN Controller with Current Source", chapter 4.1.2, 23 May 2017).

In automatic address allocation in data bus systems, a bus shunt per bus slave is switched in the data bus. This bus shunt is used in the address allocation. Afterwards, it is no longer necessary.

In order to further reduce the losses in a data bus system, in which the automatic address allocation is completed, it is desirable to use bus shunts which have a relatively low ohmic resistance. However, it is thereby problematic that the addressing current, which the automatically to be addressed bus slaves to be addressed supply into the bus line, must be increased in order to achieve sufficiently large measuring signals. The risk then exists that the maximum bus current load is exceeded for the data bus system. The limit, up to which a bus slave to be addressed, which is not yet addressed, increases its addressing current supplied into the bus line, is thus equal to the maximum load limit of the bus system, at which point the bus master would diagnose a fault.

The case of a mixed system, with bus slaves to be addressed with comparatively large bus shunts and bus slaves to be addressed with smaller bus shunts, is problematic. It is true that this type of mixed system should be implementable from the point of view of backwards compatibility, i.e., with regard to the possibility of replacing, when needed, only some of the bus slaves with comparatively large bus shunts with new bus slaves with smaller bus shunts.

SUMMARY

It is the object of the disclosure to specify a method for allocating addresses in a serial data bus system in which conventionally addressable bus slaves are used together with new types of bus slaves, whose bus shunts are smaller.

To solve this problem, a method according to the disclosure functions for identifying bus slaves in a serial data bus system in order to allocate addresses in the serial data bus system, which has a bus line, a bus master, and multiple bus slaves, wherein the bus master is connected to the bus line on one side and the bus slaves are successively connected to the bus line on the other side when viewed from the bus master, wherein one of the bus slaves is the first bus slave, which is connected to the bus line closest to the bus master, and the other bus slaves are connected to the bus line upstream of the first bus slave, with respect to the direction of a current flowing in the bus line to the bus master, or, expressed another way, one of the bus slaves is the last bus slave BS8, which is connected to the bus line farthest away from the bus master, and the other bus slaves are connected to the bus line downstream of this last bus slave, with respect to the direction of a current flowing in the bus line to the bus master, wherein at least two of the bus slaves are designed as addressable bus slaves to be addressed, to which an address is respectively allocated by the bus master in an addressing phase, and others of the bus slaves may be provided as standard bus slaves with an address already determined prior to carrying out the addressing phase, wherein the bus slaves to be addressed include at least one bus slave to be addressed of a first type and at least one bus slave to be addressed of a second type, different from the first type, wherein a current measuring means, electrically switched in the bus line, is assigned to each bus slave to be addressed of the first type and to each bus slave to be addressed of the second type, and each bus slave to be addressed of the first type and each bus slave to be addressed of the second type has an addressing current source controllable by the respective bus slave to be addressed, wherein the current, supplied into the bus line by the addressing current source of each bus slave to be addressed of the first type, flows through all current measuring means located in the bus line downstream of this current measuring means, with the exception of the current measuring means assigned to the respective bus slave to be addressed of the first type, wherein the current, supplied into the bus line by the addressing current source of each bus slave to be addressed of the second type, flows through both the current measuring means assigned to the respective bus slave to be addressed of the second type and also all current measuring means located in the bus line downstream of this current measuring means, wherein, to allocate addresses to bus slaves to be addressed of the first type and of the second type which are not yet addressed, a plurality of identification cycles is carried out, and one of the not yet addressed bus slaves to be addressed of the first type or of the second type is identified per identification cycle, and an identified bus slave to be addressed of the first type or of the second type no longer participates in further identification cycles, wherein, per identification cycle
in an offset adjustment:
each of the not yet addressed bus slaves to be addressed of the first type and each of the not yet addressed bus slaves to be addressed of the second type measures a potential idle current by means of the current measuring means respectively assigned to it, in a first phase (preselect phase):

the addressing current source of each not yet addressed bus slave to be addressed of the first type supplies a preselect single current into the bus line, each of the not yet addressed bus slave to be addressed of the first type measures a bus current by means of the current measuring means respectively assigned to it, and the addressing current sources of each not yet addressed bus slave to be addressed of the second type supply a preselect single current into the bus line of a magnitude such that the current, which is detected by the current measuring means assigned to the respective bus slave to be addressed of the second type, is equal to or is substantially equal to a predeterminable maximum current, and in a second phase (select phase) following the first phase:

the addressing current sources of those bus slaves to be automatically addressed of the first type, whose assigned current measuring means respectively detect a bus current in the first phase which is smaller than the maximum current or is equal to or substantially (see below for a definition regarding this) equal to the maximum current, supply an addressing current that is increased with respect to the first current, and the addressing current sources of those bus slaves to be addressed of the first type, whose assigned current measuring means respectively detect a bus current in the first phase which is greater than the maximum current, do not supply an addressing current, the addressing current sources of the bus slaves to be addressed of the second type are controlled so that the bus current, which the current measuring means assigned to the respective bus slave to be addressed of the second type detects, is equal to or substantially (see below for a definition regarding this) equal to the maximum current, and at the end of the second phase, that bus slave to be addressed is identified, from among the not yet addressed bus slaves to be addressed of the first type, which is the bus slave to be addressed connected to the bus line farthest away from the bus master, i.e., is the respectively last bus slave to be addressed in the relevant cycle, in that a bus slave to be addressed of the first type is identified as the last connected to the bus line in that the current measuring means assigned to this bus slave to be addressed of the first type detects in the second phase a bus current, which is not increased with respect to the idle current of the offset adjustment or is not increased by more than a predeterminable threshold value with respect to the idle current of the offset adjustment, and a bus slave to be addressed of the second type is identified as the last connected to the bus line in that its addressing current source supplies an addressing current in the second phase which is the equal or substantially (see below for a definition regarding this) equal to the bus current, which the current measuring means assigned to this bus slave to be addressed of the second type measures in the first phase, i.e., its addressing current source supplies an addressing current into the bus line in the first and in the second phase that is unchanged, or substantially (see below for a definition regarding this) unchanged with respect to a predeterminable tolerance value, which addressing current is equal to or substantially (see below for a definition regarding this) equal to the maximum current, deviating by less than a predeterminable tolerance value (which means that no significant changes occur).

Current measuring means, as used herein, can be a current measuring circuit arranged to measure or enable measurement of a current. The current measuring circuit may include one or more passive electronic components such as resistors (e.g., shunts) and may further include one or more active components such as op-amps and current sources.

In the method according to the disclosure, as provided for a serial LIN data bus system, an offset adjustment is initially carried out per addressing cycle, in which each of the not yet addressed bus slaves to be addressed of the first type and each of the not yet addressed bus slaves to be addressed of the second type measures a potential idle current by means of the current measuring means respectively assigned to it. Subsequently, as is likewise provided in a serial LIN data bus system, a group of not yet addressed bus slaves to be addressed is selected in a first (preselect) phase, in order to then identify in the following second (select) phase of an addressing cycle the not yet addressed bus slave to be addressed which is connected to the bus farthest away, when viewed from the bus master.

According to the disclosure, the data bus system has two types of bus slaves to be addressed, namely bus slaves to be addressed of the old first type (subsequently called first bus slaves to be addressed) and bus slaves to be addressed of the new second type (subsequently called second bus slaves to be addressed). The two types of bus slaves to be addressed differ both with respect to their connection to the bus line as well as with respect to the magnitude of the addressing current. A current measuring means is assigned to each first bus slave to be addressed (typically in the form of a bus shunt), whose ohmic resistance is greater than that of the current measuring means of the second bus slaves to be addressed. In addition, the addressing current source of a first bus slave to be addressed supplies the addressing current into the bus line in front of the current measuring means assigned to this bus slave to be addressed, when viewed from the bus master. During the auto-addressing phase, the current measuring means of a first bus slave to be addressed thus detects the bus current without its "own" addressing current. In contrast, the addressing current supplied by a second bus slave to be addressed flows through the current measuring means assigned to this second bus slave to be addressed.

If, as is now provided in particular for serial LIN data bus systems, the bus slave to be addressed, which is connected to the bus line farthest away from the bus master, is always to be identified per addressing cycle, in order to be able to allocate an address to this bus slave to be addressed, then, in this respect a "last" bus slave to be addressed of the first type may be identified, in that the current measuring means assigned to this bus slave to be addressed does not measure any bus current or, when minimal idle currents taking into consideration, which might be detected, for example, in an offset adjustment carried out before the first phase of an addressing cycle, does not measure a bus current which is changed in the second phase with respect to the first phase. In contrast, however, the current measuring means, which is assigned to a "last" second bus slave to be addressed connected to the bus, measures a bus current (namely its own addressing current). Thus, a strategy must be developed in order to recognize a last bus slave to be addressed of the second type in another way than by checking for a bus current of 0 amps. This is achieved according to the disclosure in that it checks whether the addressing current, supplied by a second bus slave to be addressed in the second phase of an addressing cycle, changes with respect to the first phase, namely decreases, or whether the addressing current in the second phase is equal to the addressing current in the first phase. Namely only then, when a bus slave to be addressed of the second type is connected as the last, i.e. the bus slave which is farthest away when viewed from the bus master, will its addressing current not change in the second phase of an addressing cycle from that in the first phase of the addressing cycle. This is because, according to the disclosure, each second bus slave to be addressed supplies an addressing current into the bus line such that the current measuring means of this relevant second bus slave to be addressed measures an existing, predetermined maximum bus current during the address allocation. In combination with the fact that bus slaves to be addressed of the first type supply a larger addressing current in the second phase of an addressing cycle than in the first phase, there thus arises, as will be subsequently described, the possibility for identifying a bus slave to be addressed of the second type as the "last" bus slave to be addressed connected to the bus.

The identification as the last second bus slave to be addressed is achieved in that the addressing current supplied in the second phase by this bus slave to be addressed does not differ from that in the first phase.

If, when viewed from the bus master, another second bus slave to be addressed is located, for example, behind a second bus slave to be addressed, then this "penultimate" second bus slave to be addressed does not supply an addressing current in the first phase or in the second phase of an addressing cycle. This is because the second bus slave to be addressed, which is located "behind" the second bus slave to be addressed under consideration, already supplies such a large addressing current that the maximum bus current is reached. Because the penultimate second bus slave to be addressed, which is under consideration, does not supply an addressing current during the addressing cycle, it is eliminated as a candidate for the last bus slave to be addressed connected to the bus line.

If at least one first bus slave to be addressed is located behind a second bus slave to be addressed, it may be recognized, by way of a reduction of the addressing current of the second bus slave to be addressed in the second phase of an addressing cycle, that this second bus slave to be addressed may not be the last and is thus not the bus slave to be addressed connected to the bus line farthest away from the bus master. This is because, as mentioned above, the first bus slaves to be addressed supply a larger addressing current into the bus line in the second phase of a cycle than in the first phase. As the addressing current source of a second bus slave to be addressed is now controlled in as much as it automatically supplies an addressing current with a value, so that the current measuring means assigned to this second bus slave to be addressed continues to detect (only) the maximum bus current, the addressing current source of this second bus slave to be addressed is reduced. Thus, the addressing bus current of this second bus slave to be addressed decreases in the second phase from that of the first phase. That is the criterion for recognizing that the aforementioned second bus slave to be addressed may not be the last, i.e., not the bus slave to be addressed, which is not yet addressed, which is farthest removed from the bus master.

According to the concept according to the disclosure, it is further possible that the data bus system may additionally also contain standard bus slaves, which already have a fixed address, thus are not automatically addressable bus slaves. These types of standard bus slaves may, in particular, also supply into the bus line to stabilize the idle currents of the same during the address allocation. This may also be the case for the first and second bus slaves to be addressed. As already mentioned above, these idle currents are metrologically detected in an offset adjustment preceding the first phase of an addressing cycle, and are automatically taken into consideration over the further course of the addressing cycle regarding the supply of the addressing currents of the second bus slaves to be addressed, as these addressing currents are subsequently directed so that the maximum bus current is not exceeded.

During the address allocation, the bus slaves to be addressed supply their addressing currents into the bus line, as described above in detail. Based on the overrunning of a predetermined maximum bus current, in the preselect phase, thus in the first phase of an addressing cycle, the number of bus slaves to be addressed, which are not yet addressed and which participate in the implementation of the second phase of the addressing cycle, is limited. Within the framework of this preselection, those bus slaves to be addressed, whose assigned current measuring means detect a bus current above the maximum bus current, reduce the addressing current again. This reduction of the addressing bus current should take place faster than the previous increase of the addressing currents. Thus, the extent, by which a bus current detected by a current measuring means exceeds (overshoots) the predetermined maximum value, may be reduced. The predetermined maximum value lies below that value, at which the bus master would detect a short circuit, and thus a fault, based on the magnitude of the current flowing through it. Basically, one strives to select the maximum bus current during the address allocation to be only slightly below the value for the detection of a short circuit in the bus line. Thus, the faster the individual addressing current sources of those bus slaves to be addressed, whose assigned current measuring means detect an overrunning of the maximum bus current during the address allocation, reduce their addressing currents, the smaller the difference may be between the "short circuit bus current" and the maximum bus current permissible during the address allocation. These previously mentioned aspects are, however, generally to be taken into consideration during the typical automatic address allocation methods used for serial data bus systems, for which reason the preceding considerations are basically familiar to the person skilled in the art.

In an example, it is provided that the current measuring means of the bus slaves to be addressed are respectively implemented as ohmic resistors, wherein the value of the ohmic resistance representing the current measuring means of a bus slave to be addressed of the second type is smaller, in particular, at least 5 times to 20 times smaller than the value of the ohmic resistance representing the current measuring means of a bus slave to be addressed of the first type. The shunt resistances of the bus slaves to be addressed of the second type are, for example, 200 mΩ, while the shunt resistances of the bus slaves to be addressed of the first type are, for example, 1Ω. The difference between the magnitudes of the bus shunts of the bus slaves to be addressed of the different types is thus a factor of ten or even more.

In another example, it may be provided that the current measuring means of a bus slave to be addressed of the first type is designed as a resistor integrated into an IC of this bus slave to be addressed, and that the current measuring means of a bus slave to be addressed of the second type is designed as a parallel connection made from a resistor integrated into an IC of this bus slave to be addressed and an external resistor arranged outside of the IC, wherein the ICs respectively provided with the integrated resistors are the same for the bus slaves to be addressed of both types. This refinement of the disclosure has the advantage that the same auto-addressing ICs may be used for the bus slaves to be addressed of both types. These ICs are provided with a bus shunt, which is designed as an integrated component. Due to an external arrangement of a second bus shunt, which is switched in parallel connection with the integrated bus shunt, the bus shunt constellation results for a bus slave to be addressed of the second type. Thus, the auto-addressing ICs of the bus slaves to be addressed of the first type may be used for the bus slave to be addressed of the second type.

As already mentioned above, the addressing current in a bus slave to be addressed of the second type must be significantly larger than the same of a bus slave to be addressed of the first type. The second addressing current may be up to 15 times or more greater than the first addressing current.

If, in a serial data bus system, only bus slaves to be addressed of the second type were used as bus slaves to be addressed, then the address allocation would proceed as is described, for example, in each of the three European patent applications EP-B-1 490 772, EP-A-2 571 200, and EP-A-2 654 246, submitted on 28 Dec. 2017, whose content is hereby incorporated by reference to the subject matter of the present patent application.

When, in conjunction with features of the disclosure "substantially equal" or the like is specified preceding or following values or ranges, then a deviation of ±50% or ±25% or ±10% or ±5% or ±2% or ±0.5% or ±0.1% is meant. A preceding or subsequently specified parameter, for example, the bus current measured by a current measuring means of a bus slave to be addressed, which is checked for equality or for substantial equality with a predetermined value, then "substantially" means a tolerance range, which alternatively has the previously mentioned deviations from the predetermined value to be compared.

The present disclosure is subsequently explained in detail with reference to the drawings. As individually shown in:

DESCRIPTION

Figure 1:
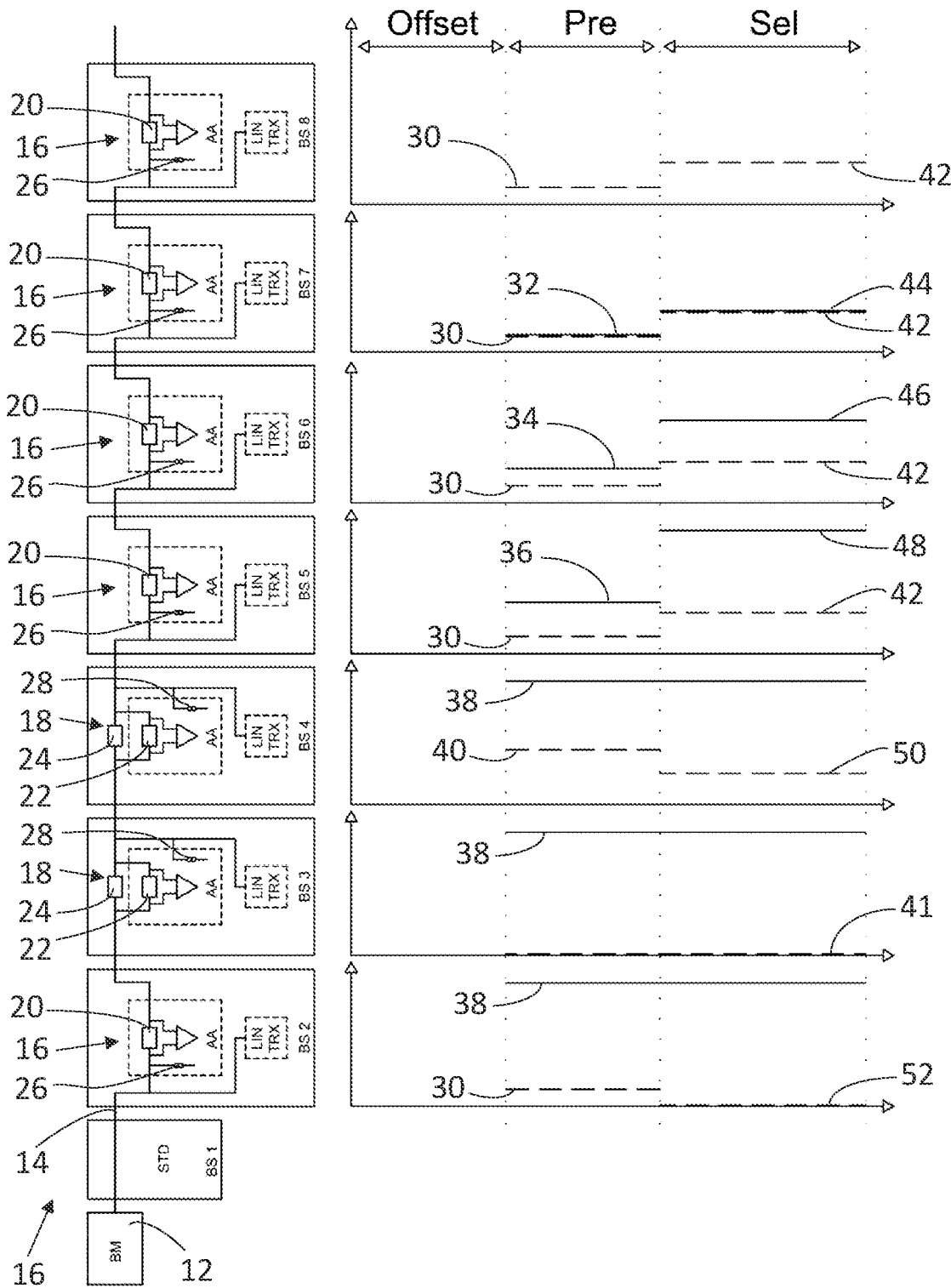
FIGS. 1 to 7 on the left in each case a serial data bus system by way of example with a bus master, a standard bus slave with a fixed address, five bus slaves to be addressed of the first type, from which the addressing current is supplied into the bus line in front of the current measuring means assigned to the relevant bus slave to be addressed, which viewed from the bus master, and two bus slaves to be addressed of the second type, from which the addressing current is supplied into the bus line behind the relevant current measuring means, when viewed from the bus master, wherein the course and the magnitude of the addressing currents respectively supplied in the individual addressing cycles is depicted aligned with each bus slave to be addressed, FIG. 8 a first example of the circuit diagram of a bus slave to be addressed of the second type (without depicting the circuitry for the application which is implemented in the bus slave to be addressed), FIG. 9 a second example of the circuit diagram of a bus slave to be addressed of the second type (without depicting the circuitry for the application which is implemented in the bus slave to be addressed), FIG. 10 a third example of the circuit diagram of a bus slave to be addressed of the second type (without depicting the circuitry for the application which is implemented in the bus slave to be addressed), and FIG. 11 a fourth example of the circuit diagram of a bus slave to be addressed of the second type (without depicting the circuitry for the application which is implemented in the bus slave to be addressed).

On the basis of FIGS. 1 to 7, it is subsequently described how the supply of the addressing currents changes during the successive addressing cycles from the perspective that a bus slave, identified in an addressing cycle and thus addressable, no longer participates in the subsequent addressing cycles. A serial data bus system 10 with a bus master 12, from which a bus line 14 extends, functions here as an example. Multiple (eight in the example) bus slaves of different types are connected in series to bus line 14, namely a standard bus slave BS1, five bus slaves to be addressed BS2 and BS5 to BS8 of the first type (subsequently called first bus slaves to be addressed) and two bus slaves to be addressed BS3 and BS4 of the second type (subsequently called second bus slaves to be addressed). In this example, standard bus slave BS1 is the bus slave connected to bus line 14, arranged closest to bus master 12. Four of the first bus slaves to be addressed, namely bus slaves to be addressed BS5 to BS8 are connected to bus line 14 farthest away from bus master 12. The still remaining first bus slave to be addressed BS2 follows standard bus slave BS1. Two second bus slaves to be addressed BS3 and BS4 are connected to bus line 14 between this first bus slave to be addressed BS2 and the four other first bus slaves to be addressed BS5 to BS8.

As is shown by way of the data bus depiction in FIGS. 1 to 7, a current measuring means 16, 18 is respectively assigned to each bus slave to be addressed BS2 to BS8. The first bus slaves to be addressed thereby each have a current measuring means 16, which is designed in this example as a single bus shunt 20. Second bus slaves to be addressed BS3 and BS4 respectively have a current measuring means 18, which is designed as a parallel connection made from two bus shunts 22, 24. It is possible here, that bus shunt 22 of each second bus slave to be addressed is substantially (see the above definition regarding this) similar to bus shunt 20 of a first bus slave to be addressed. In each case, the ohmic resistance of a current measuring means 18 of a second bus slave to be addressed is significantly smaller than the resistance of current measuring means 16 of a first bus slave to be addressed.

Each of bus slaves to be addressed BS2 to BS8 has its own addressing current source 26 or 28. Addressing current sources 26 of first bus slaves to be addressed BS2 and BS5 to BS8 supply current in front of current measuring means 16 assigned to the respective first bus slave to be addressed, when viewed from bus master 12. In contrast, current is supplied from addressing current sources 28 of second bus slaves to be addressed BS3 and BS4 at a point in bus line 14 which is located behind respectively assigned current measuring means 18, when viewed from bus master 12.

During the address allocation, the previously described addressing current sources supply current into bus line 14. This current flows to bus master 12. When taking the current direction into consideration, bus slaves to be addressed BS2 to BS7 are connected to bus line 14 downstream of bus slave to be addressed BS8. First bus slave to be addressed BS8 is the bus slave to be addressed, which is connected to bus line 14 farthest away from bus master 12 when viewed from the same. Addressing bus slaves BS3 to BS8 are arranged on bus line 14 upstream of first bus slave to be addressed BS2, which is connected to bus line 14 closest to bus master 12.

The starting point for the subsequently described address allocation is the situation, in which none of the seven addressable bus slaves to be addressed BS2 to BS8 are provided with an address or are prepared for addressing.

In a first addressing cycle (see FIG. 1), it is initially determined in an offset adjustment which current individual current measuring means 16, 18 measure, without addressing current sources 26, 28 supplying addressing current into bus line 14. In the graphic timeline of the current measured during one addressing cycle by a current measuring means, a/n (idle) current of zero is visualized here (see the respective depictions on the right in FIGS. 1 to 7). As a rule, a residual current is measured in the offset adjustment and is then taken into account in the subsequent evaluation. For reasons of simplification of the description of the method according to the disclosure, it is assumed in the present case that this residual current is zero.

In the first phase Pre of the first addressing cycle, four first bus slaves to be addressed BS5 to BS8, connected to bus line 14 farthest from bus master 12, when viewed from the same, supply a comparatively low predetermined preselect addressing current 30 into bus line 14. First bus slave to be addressed BS8, arranged farthest from bus master 12, does not detect this current 30 (i.e., its own preselect addressing current). First bus slave to be addressed BS7, arranged downstream from last first bus slave to be addressed BS8, measures bus current 32 and itself supplies preselect addressing current 30. Correspondingly, first bus slave to be addressed BS6, connected to bus line 14 adjacently downstream, detects a bus current 34, which corresponds to the sum of the preselect addressing currents which the two first bus slaves to be addressed BS7 and BS8 have supplied. It in turn supplies preselect addressing current 30. First bus slave to be addressed BS5 now measures 3 times the preselect addressing current as the bus current, thus bus current 36, and itself supplies preselect addressing current 30.

The addressing current supply in two second bus slaves to be addressed BS3 and BS4 deviates from the previously described concept. For these two bus slaves to be addressed BS3 and BS4, respective addressing current source 28 is controlled in such a way that bus current 38, measured by current measuring means 18, adopts the value $I_{target}$. Thus, second bus slave to be addressed BS4, following downstream of first bus slave to be addressed BS5, supplies an addressing current 40, which, when summed with bus current 36 coming from first bus slave to be addressed BS5, results in bus current 38, which is equal to $I_{target}$.

Additional second bus slave to be addressed BS3, arranged adjacent to second bus slave to be addressed BS4, thus receives bus current 38, which is equal to value $I_{target}$, so that its addressing current source 28 supplies an addressing current 41 of zero into bus line 14.

First bus slave to be addressed BS2, arranged closest to bus master 12, measures in turn bus current 38 at its current measuring means 16 and itself supplies its preselect addressing current 30 into bus line 14.

In the second phase Sel, following first phase Pre of the first addressing cycle, each of four first bus slaves to be addressed BS5 to BS8 now increases its addressing current, so that each of these bus slaves to be addressed supplies select addressing current 42 into bus line 14. The concept of detecting the bus current at the magnitude of the respective bus slave to be addressed is similar, with respect to four first bus slaves to be addressed BS5 to BS8, to that which was previously described for first phase Pre. First bus slave to be addressed BS8 supplies its select addressing current. Adjacent first bus slave to be addressed BS7 measures this addressing current as bus current 44 and itself supplies select addressing current 42. Next first bus slave to be addressed BS6 them measures bus current 46 as twice the select addressing current 46 supplied by the two previous first bus slaves to be addressed and itself in turn supplies select addressing current 42.

Thus, next first bus slave to be addressed BS5, when considered in the direction of bus master 12, measures bus current 48 and itself supplies select addressing current 42.

The situation now changes with regards to following second bus slave to be addressed BS4. This second bus slave to be addressed BS4 controls its addressing current source 28 in such a way that bus current 38 detected by it assumes the value $I_{target}$. In order for this to remain guaranteed, even for a bus current coming from first bus slave to be addressed BS5, in comparison to first phase Pre, second bus slave to be addressed BS4 must regulate its addressing current source 28 downward, namely from preselect addressing current 40 to select addressing current 50. Next second bus slave to be addressed BS3 continues to behave "neutrally". Its addressing current source 28 is deactivated and continues to supply addressing current 41 of zero into bus line 14.

It was already recognized during first phase Pre of the addressing cycle in the remaining first bus slave to be addressed BS2 that bus current 38 lies above the current threshold predetermined for the preselect phase. Thus, this first bus slave to be addressed BS2 recognized that it does not participate beyond the first phase in second phase Sel of the first addressing cycle. Its select addressing current 52 is thus zero.

After the conclusion of second phase Sel of the first addressing cycle, first bus slave to be addressed BS8, connected to bus line 14 farthest away from bus master 12 when viewed from the same, may now be identified as the "last" of the not yet addressed bus slaves to be addressed of both types, based on the following conditions. This is achieved in that this first bus slave to be addressed BS8 is the only bus slave to be addressed of the first type whose bus current, measured by current measuring means 16, remains unchanged with respect to the offset measurement. Thus, this last first bus slave to be addressed BS8 "knows" that, when viewed from bus master 12, there is no bus slave to be addressed present behind itself which is not yet addressed.

Within the two second bus slaves to be addressed BS3 and BS4, the decision, as to whether one of them is, in this respect, the last bus slave to be addressed which is not yet addressed, is carried out in another way. Second bus slave to be addressed BS4 recognizes that its addressing current has decreased between first phase Pre and second phase Sel. This may only be caused by the fact that current was supplied to this second bus slave to be addressed BS4 by bus slaves to be addressed arranged upstream which are not yet addressed. Thus, said second bus slave to be addressed BS4 may not be the "last" bus slave to be addressed which is not yet addressed.

In the case of additional second bus slave to be addressed BS3, the decision that it may not be the "last" bus slave to be addressed, which is not yet addressed, is carried out based on the fact that this second bus slave to be addressed has already supplied no addressing current into bus line 14 in first phase Pre of the addressing cycle. This means that, when viewed from bus master 12, there must be at least one bus slave to be addressed of the second type present, that is not yet addressed, behind this second bus slave to be addressed BS3.

In the previously described way, at the end of second phase Sel of the first addressing cycle, first bus slave to be addressed BS8 may be identified as the "last" not yet addressed bus slave to be addressed connected to bus line 14. An address may now be allocated to this bus slave directly following the first addressing cycle. However, it is also equally possible that bus master 12 "remembers" in which sequence the individual bus slaves to be addressed "report" as the respective "last" not yet addressed bus slave to be addressed, in order to finally allocate the addresses following all of the addressing cycles.

Figure 2:
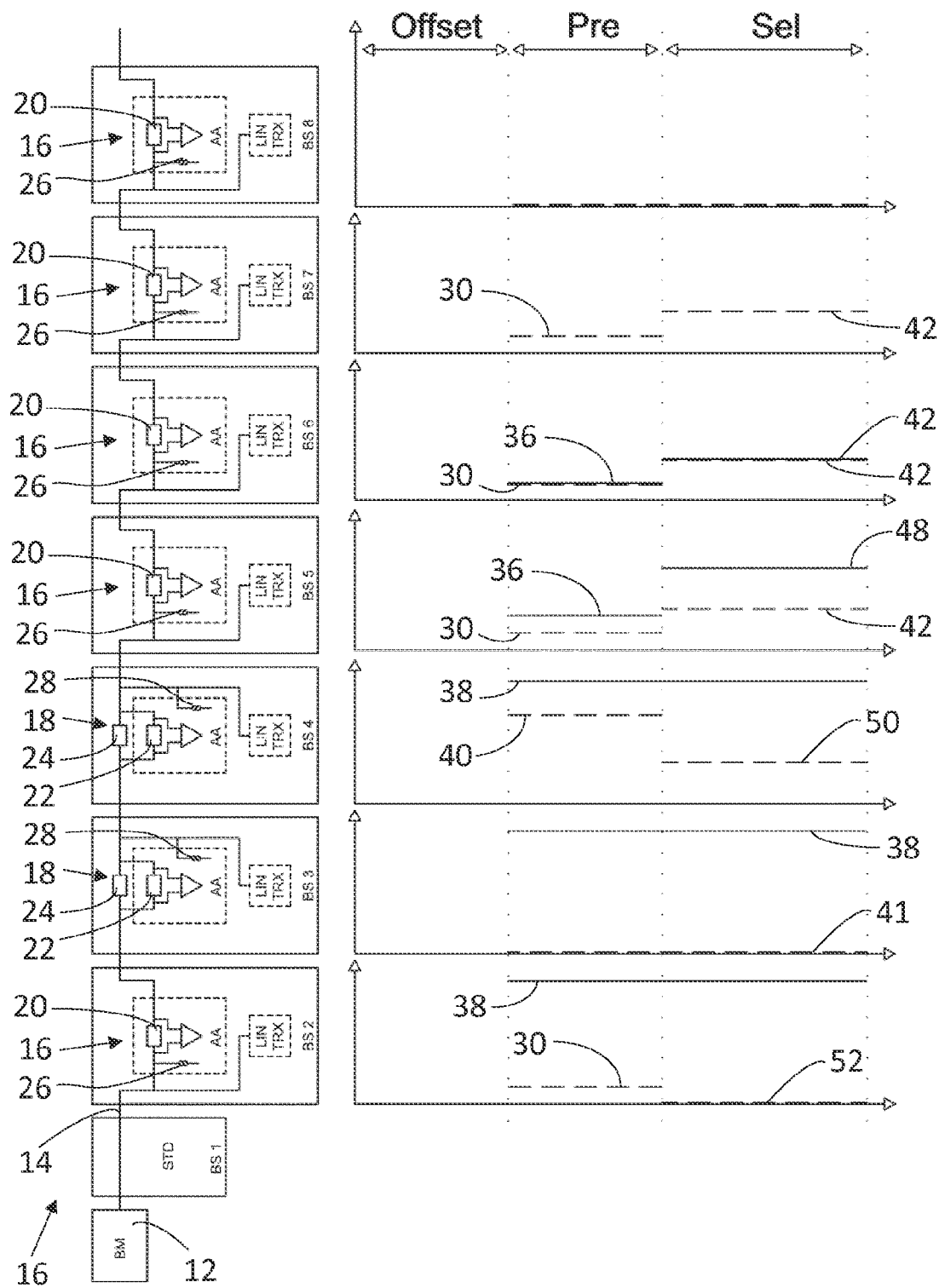

The chronological progression of the address current supply in the second addressing cycle is shown in FIG. 2. The previously identified and thus addressable or already addressed last bus slave to be addressed BS8 no longer participates. This is symbolized in FIG. 2 in that this bus slave to be addressed BS8 does not supply an addressing current.

The addressing current progressions of bus slaves to be addressed BS2 and BS7, still participating in the method, are shown in FIG. 2. Similar relationships are introduced as were described in the first addressing cycle by way of FIG. 1. That which has been said before correspondingly applies for the magnitude of the addressing currents, which individual bus slaves to be addressed BS2 to BS7 supply, and for the magnitude of the bus currents which the individual bus slaves to be addressed measure. At the end of second phase Sel of the second addressing cycle, it may be decided, based on the same circumstances as were previously described in relation to FIG. 1, that bus slave to be addressed BS7 must be that not yet addressed bus slave to be addressed, which is the last bus slave to be addressed and thus connected to the bus line farthest away from bus master 12, when viewed from the same. It again applies for bus slave to be addressed BS4 of the second type, that its addressing current in second phase Sel is reduced with respect to first phase Pre (see the transition between bus current 40 in first phase Pre and bus current 50 in second phase Sel of the second addressing cycle). Additional second bus slave to be addressed BS3 already does not supply any addressing current in first phase Pre. It is thus clear that, after the second addressing cycle, the addressable bus slave to be addressed is bus slave to be addressed BS7.

Figure 3:
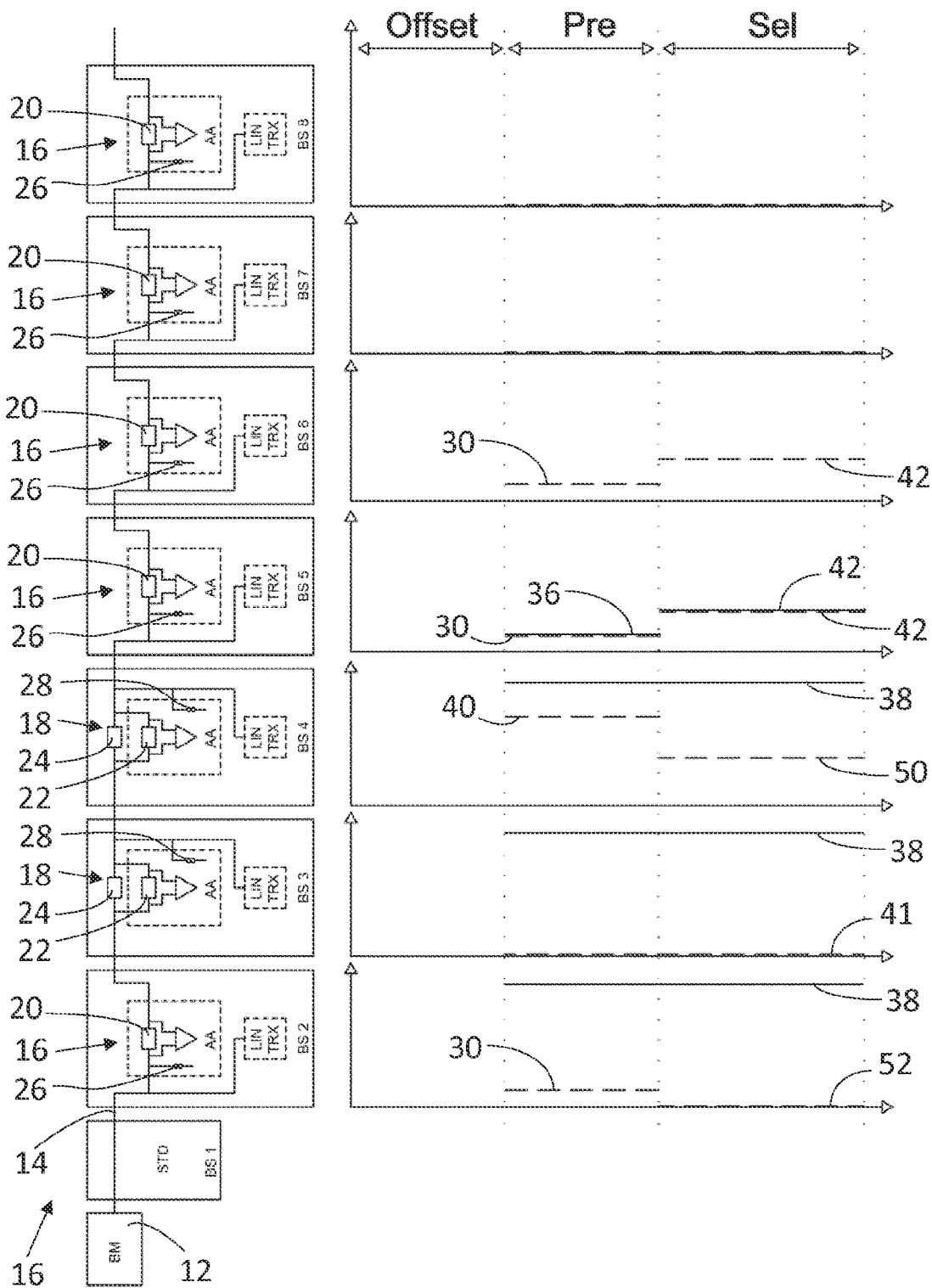

FIG. 3 shows the addressing current progressions of bus slaves to be addressed BS2 to BS6, which are not yet addressed, in the third addressing cycle. The boundary conditions for the magnitudes of the individual addressing currents supplied by bus slaves to be addressed BS2 and BS6, which are not yet addressed, and the measured bus currents correspond to the previously described description of the two previous addressing cycles. At the end of the addressing cycle according to FIG. 3, there results from the same considerations, as already explained above, that first bus slave to be addressed BS6 is the not yet addressed bus slave to be addressed connected to the bus line farthest away from bus master 12, so that an address may now be allocated to this bus slave to be addressed BS6.

Figure 4:
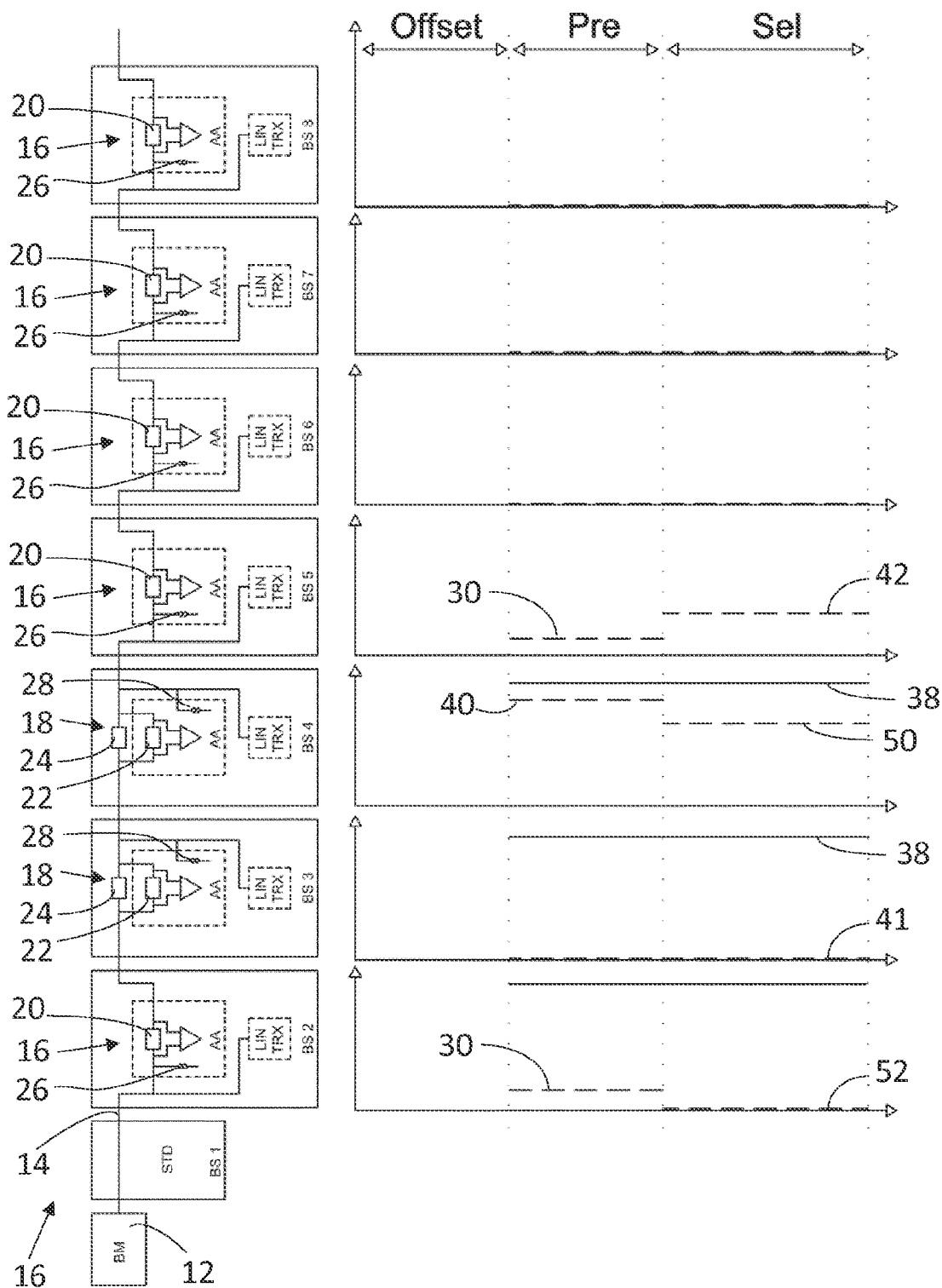

In the fourth addressing cycle according to FIG. 4, it emerges that first bus slave to be addressed BS5 is the last, not yet addressed, bus slave to be addressed according to the previous meaning, so that an address may now be allocated to it.

Figure 5:
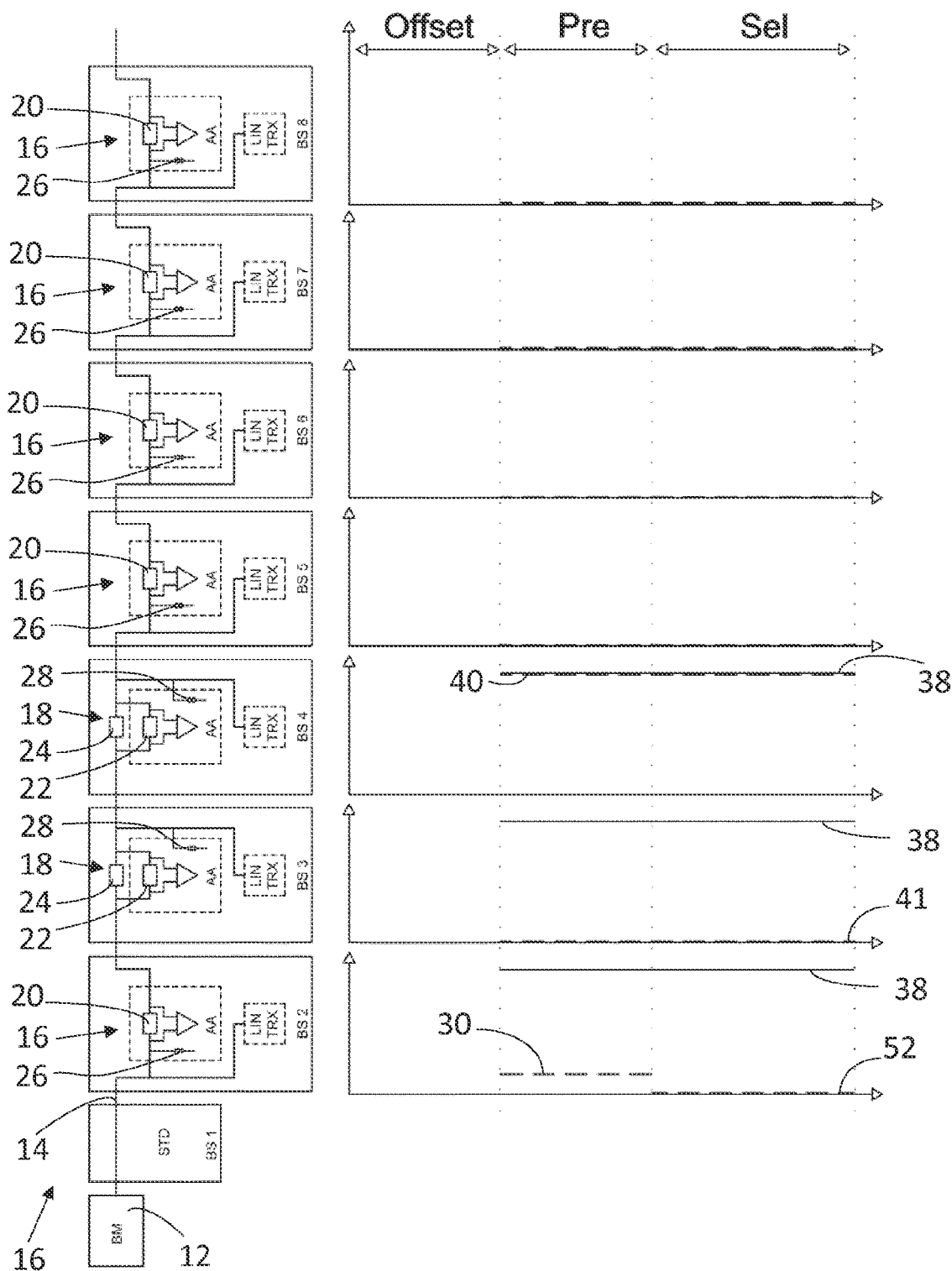

A different situation, with respect to the selection of the "last" bus slave to be addressed, arises in the fifth addressing cycle according to FIG. 5. The four first bus slaves to be addressed BS5 to BS8, connected at the end to bus line 14 and thus farthest away from bus master 12, all no longer participate in the address allocation method. Thus, bus slave to be addressed BS4 of the second type is now the "last" not yet addressed bus slave to be addressed. This is recognized due to the fact that this bus slave to be addressed BS4 supplies an addressing current into bus line 14 not equal to zero in first phase Pre of the addressing cycle, and that this addressing current does not change in second phase Sel of the addressing cycle. In contrast, second bus slave to be addressed BS3 connected downstream of said bus slave to be addressed BS4 does not supply an addressing current in first phase Pre, and subsequently also does not supply an addressing current in second phase Sel of the addressing cycle. The last remaining, not yet addressed bus slave to be addressed BS2 of the first type "notes" again already in first phase Pre of the addressing cycle that the threshold for the bus current permitted during this phase is exceeded (namely by the control of addressing current source 28 of second bus slave to be addressed BS4), for which reason it no longer participates in the address allocation in second phase Sel of this addressing cycle.

Figure 6:
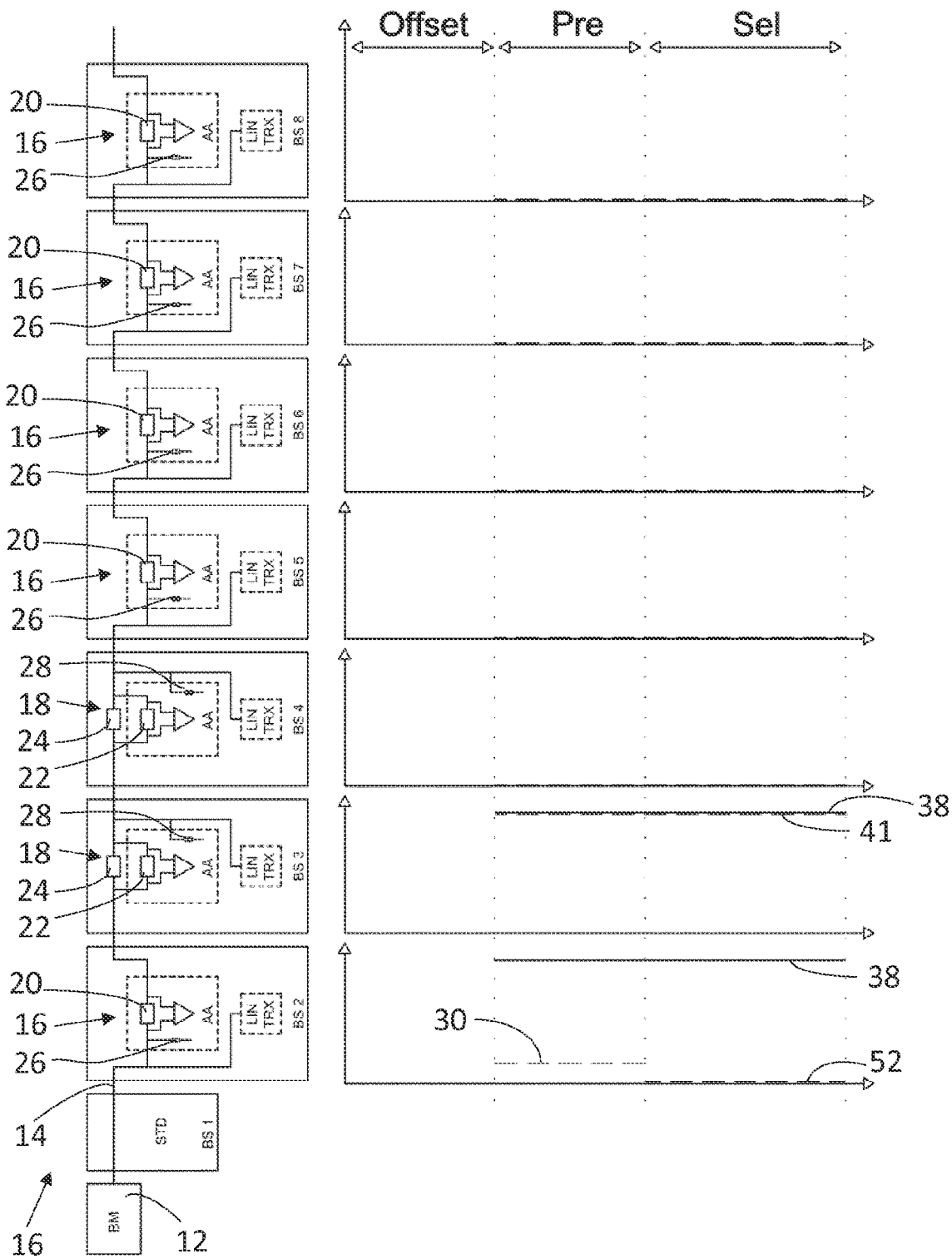
Figure 7:
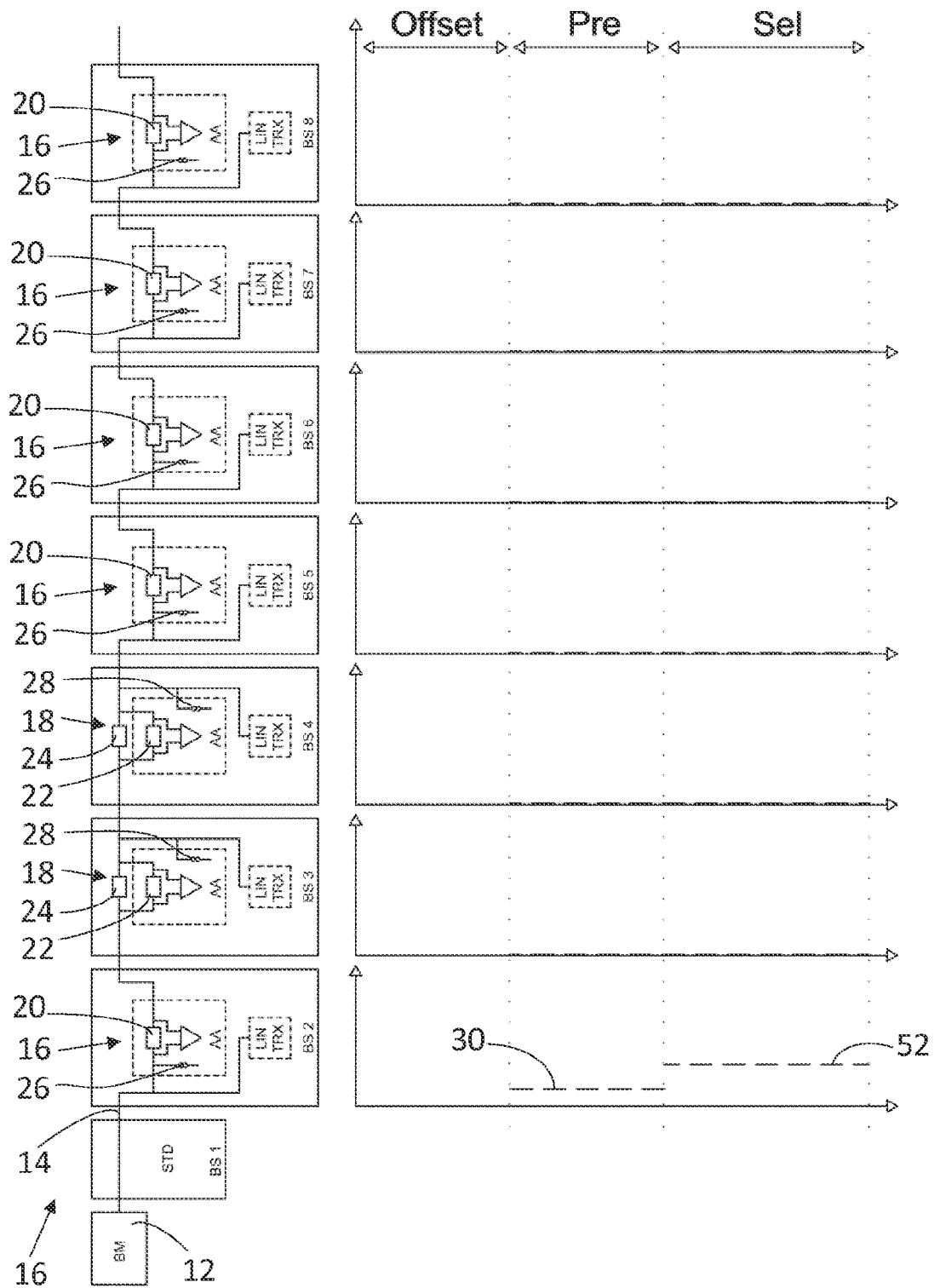

In a corresponding way, it may be recognized in the sixth addressing cycle according to FIG. 6 that, at the end of second phase Sel, bus slave to be addressed BS3 of the second type is now the last not yet addressed bus slave to be addressed, so that an address may now be allocated to it.

Finally, it results in the next (seventh) addressing cycle that not yet addressed first bus slave to be addressed BS2 is now that one, to which an address may be allocated.

Figure 8:
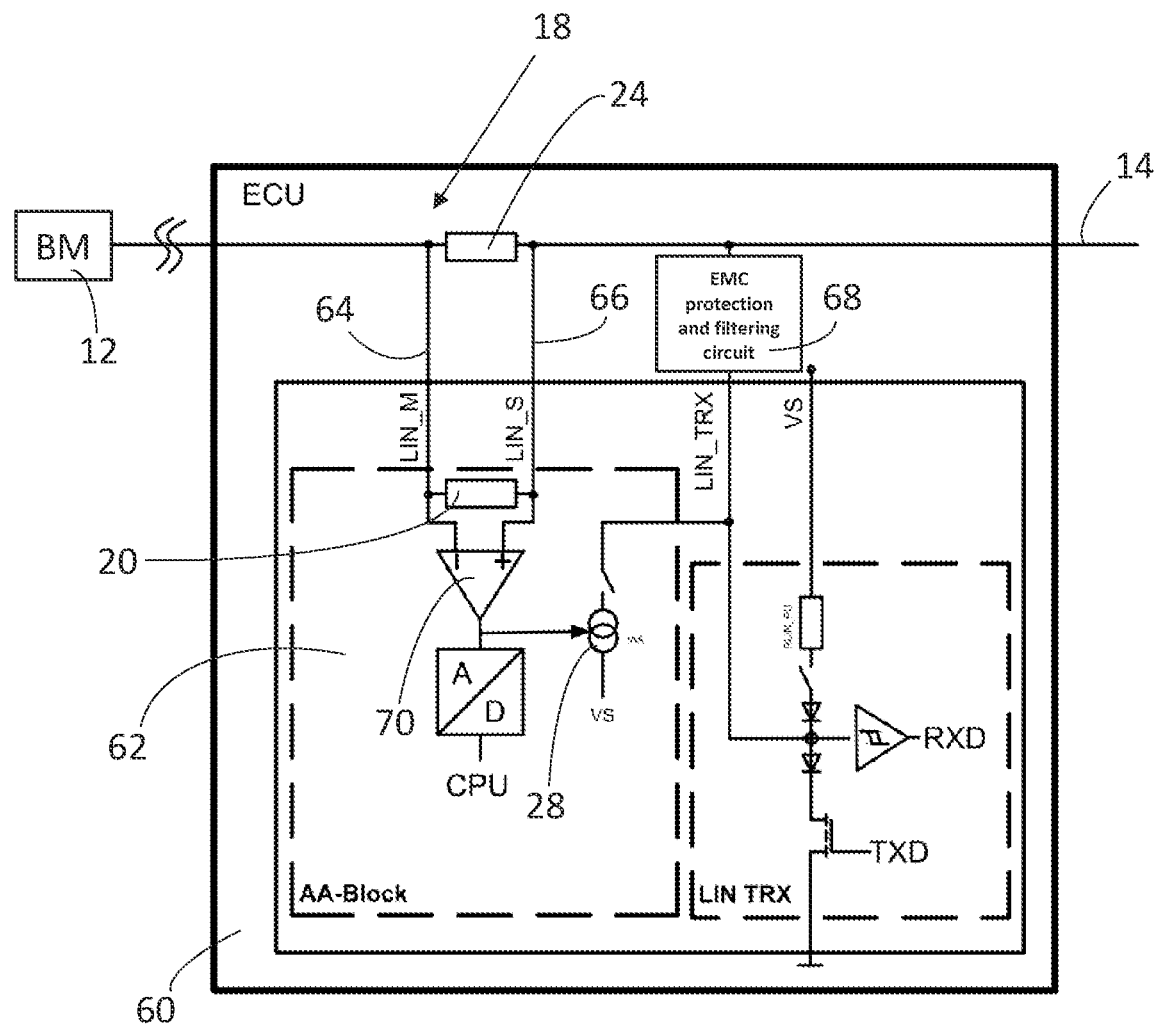

As already described above, the two types of bus slaves to be addressed differ on one hand in the location of the addressing current supply into the bus line and on the other hand in the size of their bus shunt or their current measuring means. A first example of a bus slave to be addressed 60 of the second type is shown in FIG. 8. Addressing current source 28 is, when viewed from bus master 12, arranged behind current measuring means 18 of bus slave to be addressed 60 of the second type. It thus supplies the addressing current into bus line 14 at a point so that current measuring means 18 detects the sum of the bus current and addressing current already supplied via bus line 14.

The special feature consists in that, by using the same auto-addressing IC 62, as is also used for bus slaves to be addressed of the first type, a bus slave to be addressed 60 of the second type may be developed. Said auto addressing IC 62 has integrated bus shunt 20. Second bus shunt 24 is now connected between the two connecting lines 64, 66 extending out of the IC on both sides of bus shunt 20 and connecting to bus line 14. The parallel connection made from two bus shunts 20 and 24 thus arises as an effective bus shunt, so that, per definition, this resulting bus shunt, thus current measuring means 18, has a lower ohmic resistance than bus shunt 20, thus current measuring means 16 of the bus slaves to be addressed of the first type.

In the example according to FIG. 8, the addressing current is supplied into bus line 14 via a combined EMC protection and filtering circuit 68. The voltage drop across the parallel connection of bus shunts 20 and 24, thus across the effective bus shunt, is detected by a measuring amplifier 70, and the output signal of measuring amplifier 70 is used, optionally following a signal processing, for controlling addressing current source 28, so that the current $I_{target}$ is set in bus line 14 at the level of the connection of bus slave 60 of the second type. In addition, the communication via bus line 14 with the bus slave is carried out via protection and filtering circuit 68 following the address allocation and thus during normal bus system operation.

Figure 9:
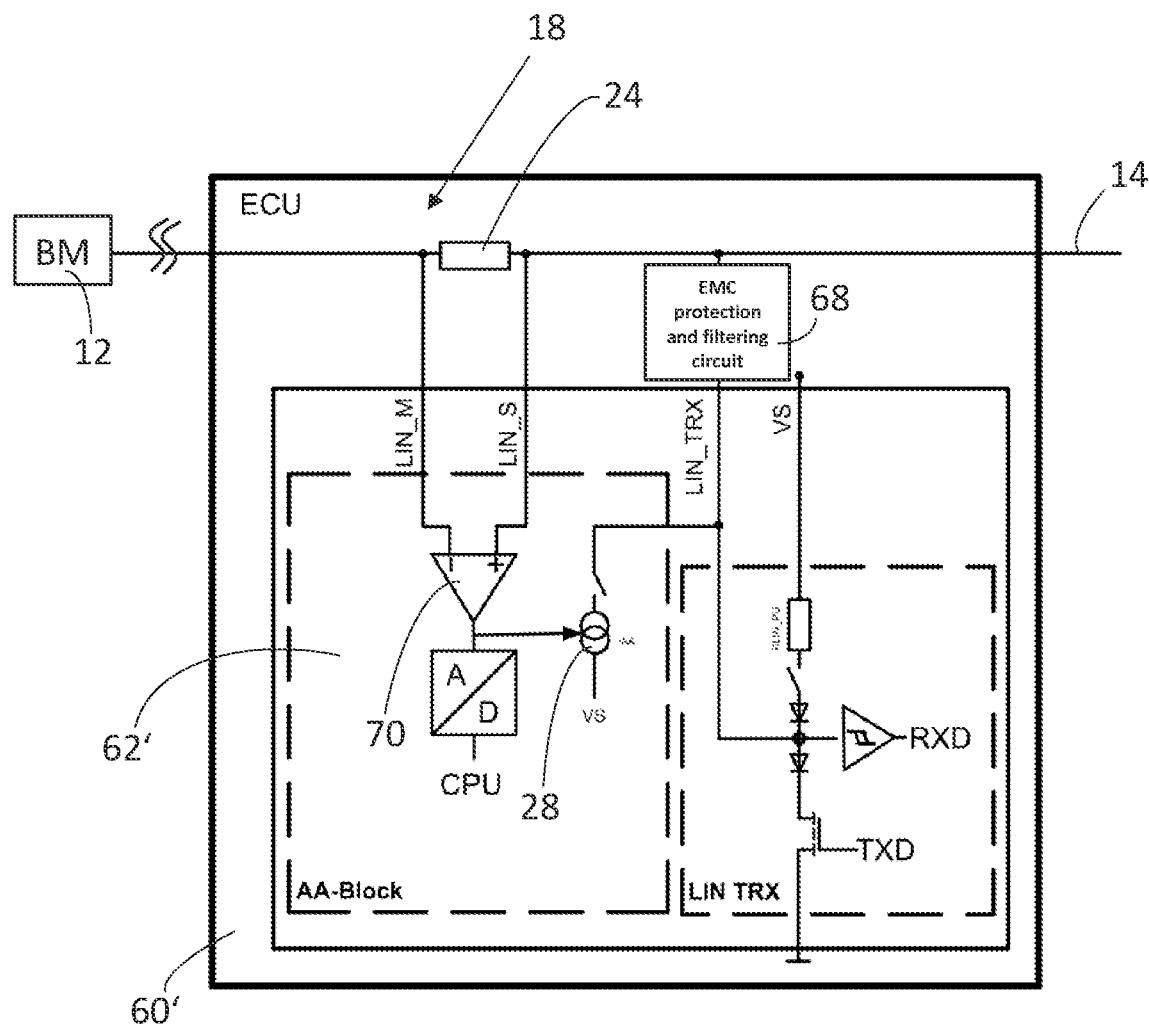

An alternative example of a bus slave to be addressed 60' of the second type is shown in FIG. 9. In contrast to the example according to FIG. 8, integrated bus shunt 20 is omitted. Current measuring means 18 thus comprises bus shunt 24 as the single bus shunt which, as is also shown in the example according to FIG. 8, is connected into bus line 14.

Figure 10:
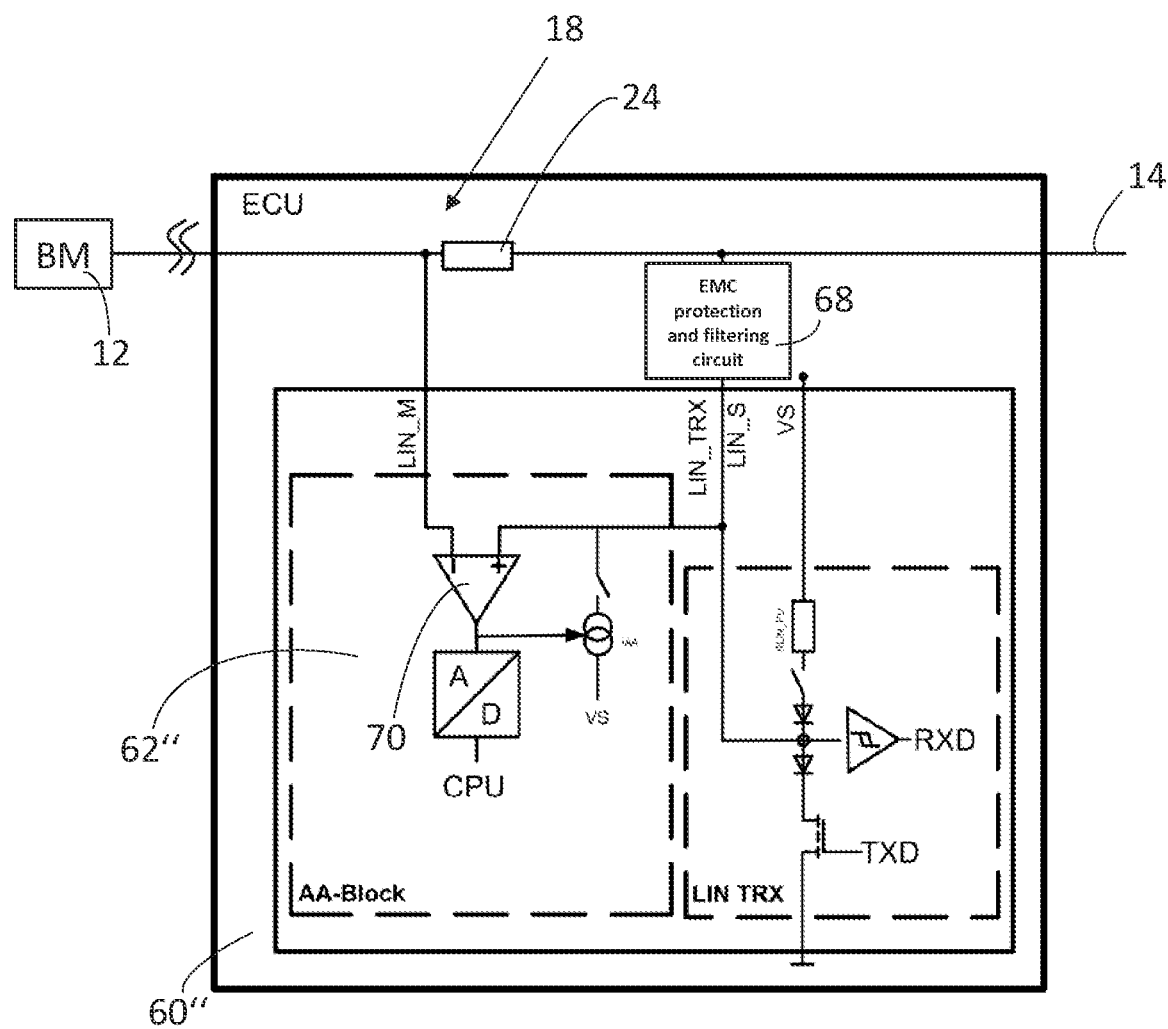

FIG. 10 shows another variant of a bus slave to be addressed 60" of the second type. In this example only two lines are guided out of addressing IC 62", wherein the bus current flowing in the level of bus slave to be addressed 60" is measured across the single present bus shunt 24 and combined EMC protection and filtering circuit 68.

Figure 11:
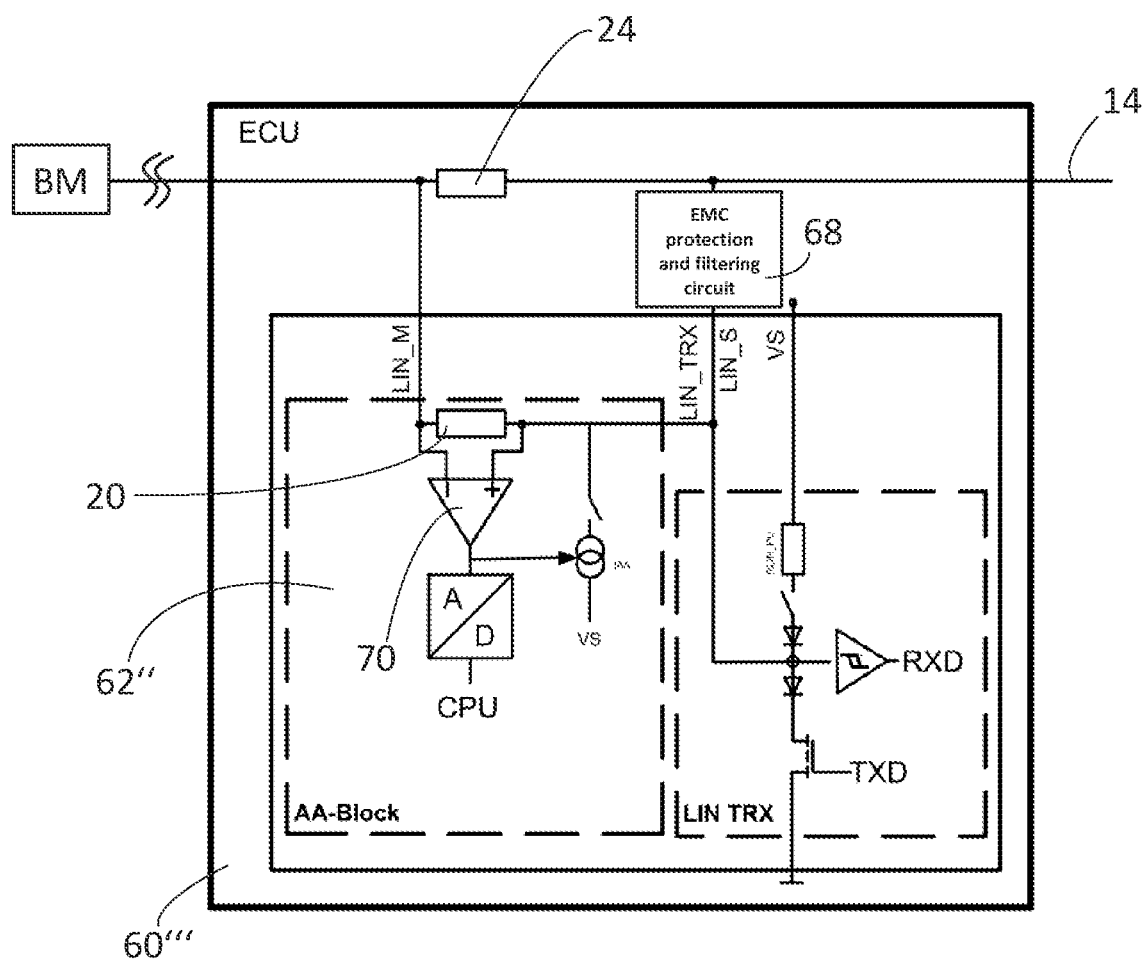

Finally, FIG. 11 shows a fourth example of a bus slave to be addressed 60'" of the second type. Auto addressing IC 62'" again has integrated bus shunt 20. As in the example according to FIG. 10, the bus current flowing at the level of bus slave to be addressed 60'" is measured as a voltage drop across the parallel connection made from integrated bus shunt 20 and the series connection made from bus shunt 24 and combined protection and filtering circuit 68.

With regard to the measuring method for the detection of the currents flowing into bus line 14 during the address allocation with respect to the level of the addressed bus slaves most free of distortion, reference is made to German patent application 10 2018 104 489.5 from 27 Feb. 2018, whose contents are hereby included in the subject matter of the present application by way of reference.

Expressed another way, an aspect according to the disclosure may be described as follows.

At the beginning of a frame, which the bus master places on the bus during the automatic addressing, time intervals are scheduled for the offset adjustment, the preselect phase (first phase), and the select phase (second phase). The address to be allocated in this addressing cycle follows from additional data, which are then transmitted.

During the offset adjustment, each bus slave to be addressed measures the idle current flowing across its current measuring means.

In the preselect phase (first phase), the bus slaves to be addressed of the first type supply a certain preset current (preselect current). As the current measuring means in the bus slaves to be addressed of the first type are located upstream of their supply points into the bus master, they do not detect their own preselect current.

Each bus slave to be addressed of the second type always "wants" to supply a current through its addressing current sources, such that a predetermined maximum current flows through its current measuring means for the preselect phase. This maximum current in the preselect phase is typically the same as in the select phase; however, the respective maximum currents of both phases may also differ from one another. Each bus slave to be addressed of the first type, which measures a current in the preselect phase, which is smaller than the maximum current, participates in the subsequent select phase. Thus, the circle of those bus slaves to be addressed of the first type, from which the last is identified, is reduced in order to then give it an address.

Thus, in that a bus slave to be addressed of the second type already supplies a current in the preselect phase such that the maximum current is reached, all of the bus slaves to be addressed of the first type, which are arranged between the bus master and the first bus slave to be addressed of the second type arranged upstream of the bus master, automatically do not participate in the select phase, as they all namely determine that the maximum current already flows through the bus.

In the select phase, the participating bus slaves to be addressed of the first type increase their supply current. Only then, when a bus slave to be addressed of the first type is located at the last position, does this bus slave to be addressed of the first type determine that the current flowing through its current measuring means in the select phase has not change with respect to the offset phase. It is therefore clear that this bus slave to be addressed of the first type is the last bus slave to be addressed, which correspondingly then takes the address of the frame currently placed on the bus.

A bus slave to be addressed of the second type notices that it is the last bus slave to be addressed, in that its addressing current source provides precisely that current, which it measures as the "total current" via its current measuring means. If it were not the last bus slave to be addressed of the second type, i. e., at least one additional bus slave to be addressed of the first type were behind it as the last bus slave to be addressed, then a measured current in the select phase would not change with respect to the preselect phase; however, it would supply a lower current through its own addressing current source than in the preselect phase. This is because an increased current flows in the bus from the last bus slave to be addressed (of the first type) in the select phase with respect to the preselect phase. Moreover, another bus slave to be addressed of the second type might not be arranged behind the e. g. penultimate bus slave to be addressed of the second type currently under consideration, as this additional bus slave to be addressed of the second type would have supplied a large addressing current in the preselect phase, so that the penultimate bus slave to be addressed of the second type would already have detected the maximum current with its current measuring means, and thus no longer have participated in the subsequence select phase.

If a bus slave to be addressed of the first type were thus still located as the last bus slave to be addressed behind the penultimate bus slave to be addressed of the second type, then the bus slave to be addressed of the second type would have reduced its addressing current in the select phase, as namely a larger current would be supplied by the last bus slave to be addressed (of the first type) in the select phase in comparison with the preselect phase, so that the penultimate bus slave to be addressed of the (second type) would reduce its addressing current in order to not exceed the maximum current which flows through its current measuring means.

A bus slave to be addressed of the second type is thus always recognized (i.e., recognizes itself as the last bus slave to be addressed) in that its addressing current source supplies into the bus that current, which the bus slave to be addressed of the second type measures with its current measuring means. This generally applies, regardless of whether the predetermined maximum current in the bus for the preselect phase is the same or different from the maximum current which is predetermined for the select phase.

The disclosure has at least one or some of the subsequently listed groups of features or one or some of the features of one or more of the subsequently listed groups of features:

1. A method for identifying bus slaves in a serial data bus system in order to allocate addresses in the serial data bus system, which has a bus line, a bus master, and multiple bus slaves, wherein the bus master is connected to the bus line on one side and the bus slaves are successively connected to the bus line on the other side when viewed from the bus master, wherein one of the bus slaves is closest bus slave BS1, which is connected to the bus line closest to bus master 12, and the other bus slaves are connected to bus line 14 upstream of closest bus slave BS1, with respect to the direction of a current flowing in bus line 14 to bus master 12, or, expressed another way, one of the bus slaves is last bus slave BS8, which is connected to bus line 14 farthest from bus master 12, and the other bus slaves are connected to the bus line downstream of this last bus slave, with respect to the direction of a current flowing in bus line 14 to bus master 12, wherein at least two of the bus slaves are designed as addressable bus slaves to be addressed BS2-BS8, to which an address is respectively allocated by bus master 12 in an addressing phase, and others of the bus slaves may be provided as standard bus slaves BS1 with an address already determined prior to carrying out the addressing phase, wherein the bus slaves to be addressed include at least one bus slave to be addressed BS2, BS5-BS8 of a first type and at least one bus slave to be addressed BS3, BS4 of a second type, different from the first type, wherein a current measuring means 16, 18, electrically switched in bus line 14, is assigned to each bus slave to be addressed BS2, BS5-BS8 of the first type and to each bus slave to be addressed BS3, BS4 of the second type, and each bus slave to be addressed BS2, BS5-BS8 of the first type and each bus slave to be addressed BS3, BS4 of the second type has an addressing current source 26, 28 controllable by the respective bus slave to be addressed BS2-BS8, wherein the current, supplied into bus line 14 by addressing current source 26 of each bus slave to be addressed BS2, BS5-BS8 of the first type, flows through all current measuring means 26, 28 located in bus line 14 downstream of this current measuring means 26, with the exception of the current measuring means 26 assigned to the respective bus slave to be addressed BS2, BS5-BS8 of the first type, wherein the current, supplied into bus line 14 by addressing current source 28 of each bus slave to be addressed BS3, BS4 of the second type, flows through both current measuring means 28 assigned to respective bus slave to be addressed BS3, BS4 of the second type and also all current measuring means 26, 28 located in bus line 14 downstream of this current measuring means 28, wherein, to allocate addresses to bus slaves to be addressed BS2-BS8 of the first type and of the second type which are not yet addressed, a plurality of identification cycles is carried out, and one of the not yet addressed bus slaves to be addressed BS2-BS8 of the first type or of the second type is identified per identification cycle, and an identified bus slave to be addressed BS2-BS8 of the first type or of the second type no longer participates in further identification cycles, wherein, per identification cycle
in an offset adjustment:
each of the not yet addressed bus slaves to be addressed BS2, BS5-BS8 of the first type and each of the not yet addressed bus slaves to be addressed BS3, BS4 of the second type measures a potential current by means of current measuring means 26, 28 respectively assigned to it, in a first phase:
addressing current source 26 of each not yet addressed bus slave to be addressed BS2, BS5-BS8 of the first type supplies a preselect single current into bus line 14, which preferably increases up to a predetermined value, wherein those bus slaves to be addressed BS2, BS5-BS8 of the first type which are not yet addressed and whose assigned current measuring means 26 detects a preselect total current, which is greater than a predeterminable maximum current, do not supply any preselect single current into bus line 14, and addressing current source 28 of each not yet addressed bus slave to be addressed BS3, BS4 of the second type supplies a preselect single current into bus line 14 of a magnitude such that the current, which is detected by current measuring means 28 assigned to the respective bus slave to be addressed BS3, BS4 of the second type, is equal to the maximum current, and in a second phase following the first phase:
addressing current sources 26 of those bus slaves to be addressed BS2, BS5-BS8 of the first type, whose assigned current measuring means 26 respectively detect a bus current, which is smaller than the maximum current, supply a select single current increased with respect to the first phase, and addressing current sources 28 of the bus slaves to be addressed BS3, BS4 of the second type are controlled so that the bus current, which current measuring means 28 assigned to the respective bus slave to be addressed BS3, BS4 of the second type detects, is equal to the maximum current, and at the end of the second phase, that bus slave to be addressed BS2-BS8 is identified, from among the not yet addressed bus slaves to be addressed BS2-BS8 of the first type and the second type, which is bus slave to be addressed BS2-BS8 connected to bus line 14 farthest away from bus master 12, i.e., is the respectively last bus slave to be addressed BS2-BS8, in that a bus slave to be addressed BS2, BS5-BS8 of the first type is identified as the last connected to bus line 14, in that current measuring means 28 assigned to this bus slave to be addressed BS2, BS5-BS8 of the first type detects a bus current in the second phase, which is not increased with respect the offset adjustment, and a bus slave to be addressed BS3, BS4 of the second type is identified as the last connected to bus line 14, in that its addressing current source 28 supplies an addressing current into bus line 14 in the first phase which is not equal to zero, and that this addressing current does not change in the second phase.

2. The method, wherein current measuring means 26, 28 of bus slaves to be addressed BS2-BS8 of the first type and of the second type are respectively implemented as ohmic resistors, wherein the value of the ohmic resistance representing current measuring means 26 of a bus slave to be addressed BS2, BS5-BS8 of the first type is greater, in particular, at least 2 times to 20 times greater that the value of the ohmic resistance representing current measuring means 28 of a bus slave to be addressed BS3, BS4 of the second type.

3. The method, wherein current measuring means 26 of a bus slave to be addressed BS2, BS5-BS8 of the first type is designed as a resistor integrated into an IC 62 of this bus slave to be addressed BS2, BS5-BS8 of the first type, and wherein current measuring means 28 of a bus slave to be addressed BS3, BS4 of the second type is designed as a parallel connection made from a resistor integrated into an IC 60 of this bus slave to be addressed BS3, BS4 of the second type and an external resistor arranged outside of IC 60, wherein respective ICs 60, provided with integrated resistors, of bus slaves to be addressed BS2, BS5-BS8 of the first type and of bus slaves to be addressed BS2-BS8 of the second type are identical.

4. The method, wherein a bus slave to be addressed BS2-BS8 of the first type or of the second type, identified in an identification cycle, is allocated an address by bus master 12 before the beginning of the next identification cycle.

5. The method, wherein bus slaves to be addressed BS3, BS4 of the first type and of the second type are allocated addresses by bus master 12 only after carrying out the last identification cycle.

6. A method for allocating addresses in a serial data bus system which has a bus line, a bus master, and multiple bus slaves, wherein the bus master is connected to the bus line on one side and the bus slaves are successively connected to the bus line on the other side when viewed from the bus master, wherein one of the bus slaves is first bus slave BS1, which is connected to the bus line closest to bus master 12, and the other bus slaves are connected to bus line 14 upstream of first bus slave BS1, with respect to the direction of a current flowing in bus line 14 to bus master 12, or, expressed another way, one of the bus slaves, which is connected to bus line 14 farthest from bus master 12, is last bus slave BS8, and the other bus slaves are connected to the bus line downstream of this last bus slave, with respect to the direction of a current flowing in bus line 14 to bus master 12, wherein at least two of the bus slaves are designed as addressable bus slaves to be addressed BS2-BS8, to which an address is respectively allocated by bus master 12 in an addressing phase, and others of the bus slaves may be designed as standard bus slaves BS1 with an address already determined prior to carrying out the addressing phase, wherein the bus slaves to be addressed include at least one first bus slave to be addressed BS2, BS5-BS8 of a first type and at least one second bus slave to be addressed BS3, BS4 of a second type, different from the first type, wherein a current measuring means 16, 18, electrically switched in bus line 14, is assigned to each first and each second bus slave to be addressed, and each first and each second bus slave to be addressed has an addressing current source 26, 28 controllable by the respective bus slave to be addressed, wherein the current, supplied into bus line 14 by addressing current source 26 of each first bus slave to be addressed BS2, BS5-BS8, flows through all current measuring means 26, 28 located in bus line 14 downstream of this current measuring means 26, with the exception of current measuring means 26 assigned to the respective first bus slave to be addressed, wherein the current, supplied into bus line 14 by addressing current source 28 of each second bus slave to be addressed BS3, BS4, flows through both current measuring means 28 assigned to respective second bus slave to be addressed BS3, BS4 and also all current measuring means 26, 28 located in bus line 14 downstream of this current measuring means 28, wherein, to allocate addresses to not yet addressed first and second bus slaves to be addressed BS2-BS8, a plurality of addressing cycles is carried out, and one of the not yet addressed first and second bus slaves to be addressed BS2-BS8 is identified per addressing cycle, and an identified first or second bus slave to be addressed BS2-BS8 no longer participates in further addressing cycles, wherein per addressing cycle in a first phase:

addressing current source 26 of each not yet addressed first bus slave to be addressed BS2, BS5-BS8 supplies a preselect single current into bus line 14, increasing up to a predetermined value, wherein those first bus slaves to be addressed BS2, BS5-BS8, whose assigned current measuring means 26 detect a preselect total current, which is greater than a predeterminable maximum current, do not supply any preselect single current into bus line 14, and addressing current source 28 of each not yet addressed second bus slave to be addressed BS3, BS4 supplies a preselect single current into bus line 14 of a magnitude such that the current, which is detected by current measuring means 28 assigned to respective second bus slave to be addressed BS3, BS4, is equal to the maximum current, and in a second phase following the first phase:

addressing current sources 26 of those first bus slaves to be automatically addressed BS2, BS5-BS8, whose assigned current measuring means 26 respectively detect a bus current, which is smaller than the maximum current, supply a select single current increased with respect to the first phase, and addressing current sources 28 of second bus slaves to be addressed BS3, BS4 are controlled so that the bus current, which current measuring means 28 assigned to respective second bus slave to be addressed BS3, BS4 detects, is equal to the maximum current, and at the end of the second phase, that bus slave to be addressed is identified from among the not yet addressed first and second bus slaves to be addressed BS2-BS8, which is the bus slave to be addressed connected to bus line 14 farthest away from bus master 12, i.e., is the respectively last bus slave to be addressed, in that a first bus slave to be addressed BS2, BS5-BS8 is recognized as the last connected to bus line 14, in that current measuring means 26 assigned to this first bus slave to be addressed BS2, BS5-BS8 detects a bus current in the second phase, which is not increased with respect the first phase, and a second bus slave to be addressed BS3, BS4 is identified as the last connected to bus line 14, in that its addressing current source 28 supplies its addressing current into bus line 14 in the second phase.

7. The method, wherein current measuring means 26, 28 of first and second bus slaves to be addressed BS2-BS8 are respectively implemented as ohmic resistors, wherein the value of the ohmic resistance representing current measuring means 26 of a first bus slave to be addressed BS2, BS5-BS8 is greater, in particular, at least 2 times to 20 times greater than the value of the ohmic resistance representing current measuring means 28 of a second bus slave to be addressed BS3, BS4.

8. The method, wherein current measuring means 26 of a first bus slave to be addressed BS2, BS5-BS8 is designed as a resistor integrated into an IC 62 of this bus slave to be addressed BS2, BS5-BS8, and wherein current measuring means 28 of a second bus slave to be addressed BS3, BS4 is designed as a parallel connection made from a resistor integrated into an IC 60 of this second bus slave to be addressed BS3, BS4 and an external resistor arranged outside of IC 60, wherein respective ICs 60, provided with integrated resistors, of first and second bus slaves to be addressed BS2-BS8, are identical.

9. The method, wherein an address is allocated by bus master 12 to a first or second bus slave to be addressed BS2-BS8 identified in an addressing cycle before the beginning of the next addressing cycle.

10. The method, wherein addresses are allocated by bus master 12 to first and second bus slaves to be addressed BS2-BS8 only after carrying out the last addressing cycle.

LIST OF REFERENCE NUMERALS

10 Data bus system
12 Bus master
14 Bus line
16 Current measuring means
18 Current measuring means
20 Bus shunt
22 Bus shunt
24 Bus shunt
26 Addressing current source
28 Addressing current source
30 Preselect addressing current
32 Bus current
34 Bus current
36 Bus current
38 Bus current
40 Preselect addressing current
41 Preselect or select addressing current
42 Select addressing current
44 Bus current
46 Select addressing current
48 Bus current
50 Select addressing current
52 Select addressing current
60 Bus slave to be addressed
60' Bus slave to be addressed
60" Bus slave to be addressed
60''' Bus slave to be addressed
62 Auto-addressing IC
62" Auto-addressing IC
64 Connecting line
66 Connecting line
68 EMC protection and filtering circuit
70 Measuring amplifier
BS1 Standard bus slave
BS2 Bus slave to be addressed of the first type
BS3 Bus slave to be addressed of the second type
BS4 Bus slave to be addressed of the second type
BS5 Bus slave to be addressed of the first type
BS6 Bus slave to be addressed of the first type
BS7 Bus slave to be addressed of the first type
BS8 Bus slave to be addressed of the first type

The invention claimed is:

1. A method for identifying bus slaves in a serial data bus system in order to allocate addresses in the serial data bus system, which has a bus line, a bus master, and multiple bus slaves, wherein the bus master is connected to the bus line on a first side and the bus slaves are successively connected to the bus line on a second side of the bus master, wherein one of the bus slaves is a first bus slave (BS1), which is connected to a bus line closest to the bus master, and the other bus slaves are connected to a bus line upstream of the first bus slave (BS1), with respect to a direction of a bus current flowing in the bus line to the bus master, wherein at least two of the bus slaves are designed as addressable bus slaves to be addressed (BS2-BS8), to which one of the addresses is respectively allocated by the bus master in an addressing phase, and others of the bus slaves may be provided as standard bus slaves (BS1) with respective addresses determined prior to carrying out the addressing phase, wherein the bus slaves to be addressed include at least one bus slave to be addressed (BS2, BS5-BS8) of a first type and at least one bus slave to be addressed (BS3, BS4) of a second type, different from the first type, wherein a current measuring circuit, electrically switched in the bus line, is assigned to each of the bus slaves to be addressed (BS2, BS5-BS8) of the first type and to each of the bus slaves to be addressed (BS3, BS4) of the second type, and each of the bus slaves to be addressed (BS2, BS5-BS8) of the first type and each of the bus slaves to be addressed (BS3, BS4) of the second type has a respective addressing current source controllable by the respective bus slave to be addressed (BS2-BS8), wherein a first current, supplied into the bus line by the respective addressing current source of each of the bus slaves to be addressed (BS2, BS5-BS8) of the first type, flows through all current measuring circuits located in the bus line downstream of this current measuring circuit, with the exception of the current measuring circuit assigned to the respective bus slave to be addressed (BS2, BS5-BS8) of the first type, wherein a second current, supplied into the bus line by the respective addressing current source of each of the bus slaves to be addressed (BS3, BS4) of the second type, flows through both the current measuring circuit assigned to the respective bus slave to be addressed (BS3, BS4) of the second type and also all the current measuring circuits located in the bus line downstream of this current measuring circuit, wherein, to allocate the addresses to bus slaves to be addressed (BS2-BS8) of the first type and of the second type which are not yet addressed, a plurality of the identification cycles is carried out, and one of the not yet addressed bus slaves to be addressed (BS2-BS8) of the first type or of the second type is identified per identification cycle, and the identified bus slave to be addressed (BS2-BS8) of the first type or of the second type no longer participates in further identification cycles, wherein, per identification cycle in an offset adjustment:

each of the not yet addressed bus slaves to be addressed (BS2, BS5-BS8) of the first type and each of the not yet addressed bus slaves to be addressed (BS3, BS4) of the second type measures a potential idle current of the current measuring circuit respectively assigned to it, in a first phase:

the addressing current source of each of the not yet addressed bus slaves to be addressed (BS2, BS5-BS8) of the first type supplies a preselect single first current into the bus line, each of the not yet addressed bus slaves to be addressed (BS2, BS5-BS8) of the first type measures the bus current by the current measuring circuit respectively assigned to it, and the addressing current source of each of the not yet addressed bus slave to be addressed (BS3, BS4) of the second type supplies a preselect single second current into the bus line of a magnitude such that the bus current, which is detected by the current measuring circuit assigned to the respective bus slave to be addressed (BS3, BS4) of the second type, is equal to or substantially equal to a maximum current, and in a second phase following the first phase:

the addressing current sources of bus slaves to be addressed (BS2, BS5-BS8) of the first type, whose assigned current measuring circuit respectively detects a bus current in the first phase, which is smaller than the maximum current or equal to or substantially equal to the maximum current, supply the first current that is increased with respect to the first phase, and the addressing current sources of bus slaves to be addressed (BS2, BS5-BS8) of the first type, whose assigned current measuring circuit respectively detects a bus current in the first phase which is greater than the maximum current, do not supply the first current, the addressing current sources of the bus slaves to be addressed (BS3, BS4) of the second type are controlled so that the bus current, which the current measuring circuit assigned to the respective bus slave to be addressed (BS3, BS4) of the second type detects, is equal to or substantially equal to the maximum current, and at an end of the second phase, a bus slave to be addressed (BS2-BS8) is identified among the not yet addressed bus slaves to be addressed (BS2-BS8) of the first type or of the second type, which is the bus slave to be addressed (BS2-BS8) connected to the bus line farthest away from the bus master in the relevant cycle, in that the bus slave to be addressed (BS2, BS5-BS8) of the first type is identified as the last connected to the bus line, in that the current measuring circuit assigned to this bus slave to be addressed (BS2, BS5-BS8) of the first type detects in the second phase a bus current, which is not increased with respect to the idle current of the offset adjustment or is not increased by more than a predeterminable threshold value with respect to the idle current of the offset adjustment, and the bus slave to be addressed (BS3, BS4) of the second type is identified as the last connected to the bus line, in that its respective addressing current source supplies the second current in the second phase which is equal to or substantially equal to the bus current, which the current measuring circuit, assigned to this bus slave to be addressed (BS3, BS4) of the second type, measures in the first phase.

2. The method according to claim 1, wherein the current measuring circuits of the bus slaves to be addressed (BS2-BS8) of the first type and of the second type are respectively implemented as ohmic resistors, wherein a value of an ohmic resistance representing the current measuring circuits of the respective bus slaves to be addressed (BS2, BS5-BS8) of the first type is at least two times greater than a value of an ohmic resistance representing the current measuring circuits of the respective bus slaves to be addressed (BS3, BS4) of the second type.

3. The method according to claim 2, wherein the current measuring circuit of each of the bus slaves to be addressed (BS2, BS5-BS8) of the first type is designed as a resistor integrated into an IC of the respective bus slave to be addressed (BS2, BS5-BS8) of the first type, and that the current measuring circuit of each of the bus slaves to be addressed (BS3, BS4) of the second type is designed as a parallel connection made from a resistor integrated into an IC of the respective bus slave to be addressed (BS3, BS4) of the second type and an external resistor arranged outside of the IC, wherein the respective ICs, provided with integrated resistors, of the bus slaves to be addressed (BS2, BS5-BS8) of the first type and of the bus slaves to be addressed (BS3, BS4) of the second type, are identical.

4. The method according to claim 1, wherein the address is allocated by the bus master to the bus slave to be addressed (BS2-BS8) of the first type or of the second type, identified in one of the identification cycles, before the beginning of a next one of the identification cycles.

5. The method according to claim 1, wherein an identifier, specifying the bus slave to be addressed (BS2-BS8), is assigned by the bus master to the bus slave to be addressed (BS2-BS8) of the first type or of the second type, identified in one of the identification cycles, before the beginning of the next one of the identification cycles, and that addresses assigned to the identifiers are allocated by the bus master to the bus slaves to be addressed (BS2-BS8) of the first type and of the second type only after carrying out a last one of the identification cycles.

6. A method for allocating addresses in the serial data bus system which has the bus line, the bus master, and multiple bus slaves, wherein the bus master is connected to the bus line on the first side and the bus slaves are successively connected to the bus line on the second side of the bus master, wherein one of the bus slaves is the first bus slave (BS1), which is connected to the bus line closest to the bus master, and the other bus slaves are connected to the bus line upstream of the first bus slave (BS1), with respect to the direction of a current flowing in the bus line to the bus master, wherein at least two of the bus slaves are designed as addressable bus slaves to be addressed (BS2-BS8), to which one of the addresses is respectively allocated by the bus master in an addressing phase, and others of the bus slaves may be provided as standard bus slaves (BS1) with respective addresses determined prior to carrying out the addressing phase, wherein the bus slaves to be addressed include at least one bus slave to be addressed (BS2, BS5-BS8) of the first type and at least one bus slave to be addressed (BS3, BS4) of the second type, different from the first type, wherein the current measuring circuit, electrically switched in the bus line (14), is assigned to each of the bus slaves to be addressed (BS2, BS5-BS8) of the first type and to each of the bus slaves to be addressed (BS3, BS4) of the second type, and each of the bus slaves to be addressed (BS2, BS5-BS8) of the first type and each of the bus slaves to be addressed (BS3, BS4) of the second type has a respective addressing current source controllable by the respective bus slave to be addressed (BS2-BS8), wherein the first current, supplied into the bus line by the respective addressing current source of each of the bus slaves to be addressed (BS2, BS5-BS8) of the first type, flows through all the current measuring circuits located in the bus line downstream of this current measuring circuit, with the exception of the current measuring circuit assigned to the respective bus slave to be addressed (BS2, BS5-BS8) of the first type, wherein the second current, supplied into the bus line by the respective addressing current source of each of the bus slaves to be addressed (BS3, BS4) of the second type, flows through both the current measuring circuit assigned to the respective bus slave to be addressed (BS3, BS4) of the second type and also all the current measuring circuits located in the bus line downstream of this current measuring circuit, wherein, to allocate the addresses to the bus slaves to be addressed (BS2 BS8) of the first type and of the second type which are not yet addressed, a plurality of the identification cycles is carried out, and one of the not yet addressed bus slaves to be addressed (BS2-BS8) of the first type or of the second type is identified per identification cycle, and the identified bus slave to be addressed (BS2-BS8) of the first type or of the second type no longer participates in further identification cycles, wherein
the method according to claim 1 is carried out and either:
(1) the address is allocated per identification cycle to the respectively identified bus slave to be addressed (BS2-BS8) of the first or of the second type before the next identification cycle, or
(2) only after carrying out the last identification cycle are the addresses, associated with the identifications assigned during the identification cycles, allocated by the bus master to the respective bus slaves to be addressed (BS2-BS8) of the first type and of the second type.

\* \* \* \* \*